United States Patent [19]
Woods

[11] Patent Number: 4,783,633
[45] Date of Patent: Nov. 8, 1988

[54] PULSE-EDGE COINCIDENCE DETECTOR AND USE OF SAME FOR SELECTING A SAMPLING SIGNAL

[75] Inventor: Brian Woods, Denzlingen, Fed. Rep. of Germany

[73] Assignee: Deutsche ITT Industries GmbH, Freiburg, Fed. Rep. of Germany

[21] Appl. No.: 51,432

[22] Filed: May 19, 1987

[30] Foreign Application Priority Data

May 23, 1986 [EP] European Pat. Off. ........ 86107040.7

[51] Int. Cl.⁴ ................. H03K 5/22; H03K 5/00; H03K 19/20
[52] U.S. Cl. .................... 328/110; 307/445; 307/352; 328/151
[58] Field of Search ............. 307/514, 445, 523, 352; 328/110, 63, 151

[56] References Cited

U.S. PATENT DOCUMENTS

| | | | |
|---|---|---|---|
| 3,918,039 | 11/1975 | Clark | 340/800 |
| 4,229,699 | 10/1980 | Frissell | 328/63 |
| 4,253,051 | 2/1981 | Schneider | 340/870.34 |
| 4,443,883 | 4/1984 | Berger | 375/110 |
| 4,668,917 | 5/1987 | Levine | 328/133 |

Primary Examiner—Stanley D. Miller
Assistant Examiner—B. P. Davis
Attorney, Agent, or Firm—T. L. Peterson

[57] ABSTRACT

An integrable circuit arrangement for deriving a coincidence pulse on coincidences of the falling edges of pulses of a digital data signal with the falling edges of pulses of sampling signals obtained by frequency division and gating and intended for use in a digital data processing system is disclosed which requires little area on an integrated-circuit chip. It contains an input gate consisting of a first NOR gate and a second NOR gate which are cross-coupled. The sampling signal is applied to the first input of the second NOR gate, and one of the system clock signals to the first input of the first NOR gate. The first input of a third NOR gate is connected via an inverter to the output of the first NOR gate, while the data signal is applied directly to the second input of the third NOR gate, and the delayed data signal is applied to the third input in inverted form.

10 Claims, 4 Drawing Sheets

4,783,633

PULSE-EDGE COINCIDENCE DETECTOR AND USE OF SAME FOR SELECTING A SAMPLING SIGNAL

BACKGROUND OF THE INVENTION

During the processing of serial data signals, care must be taken to ensure that, in the interest of unambiguity, any coincidence of the edge of a pulse of the data signal with the edge of a pulse of the sampling signal of the data processing system is prevented. In the event of such coincidences, disturbances are caused by so-called glitches. According to U.S. Pat. No. 4,229,699, therefore, one of, e.g., two sampling signals is selected whose edges do not coincide with the edges of the data signal.

Data processing systems implemented with solidstate integrated circuits require a monolithic integrated circuit for detecting such coincidences which provides a signal that triggers a process for measuring the phase relation between sampling and data signals, or a signal for switching to a suitable sampling signal.

SUMMARY OF THE INVENTION

Accordingly, the object of the present invention is to provide an integrable circuit arrangement which derives coincidence pulses on coincidences of the falling edges of a digital data signal with the falling edges of sampling signals of a digital data processing system and requires only little area on an integrated-circuit chip. The invention thus relates to an integrable circuit arrangement for deriving coincidence pulses on coincidence of the falling edges of pulses of a data signal with the falling edges of pulses of sampling signals which are present on a clock line and are derived from a two-phase system clock for the purpose of controlling a digital data processing system.

BRIEF DESCRIPTION OF THE DRAWINGS

The integrable circuit arrangement in accordance with the invention and its preferred use in a selection logic for selecting a suitable sampling signal characterized by noncoincidence of its edges with those of a data signal will now be explained with reference to the accompanying drawings, in which.

DETAILED DESCRIPTION OF A PREFERRED EMBODIMENT

Figure 1:
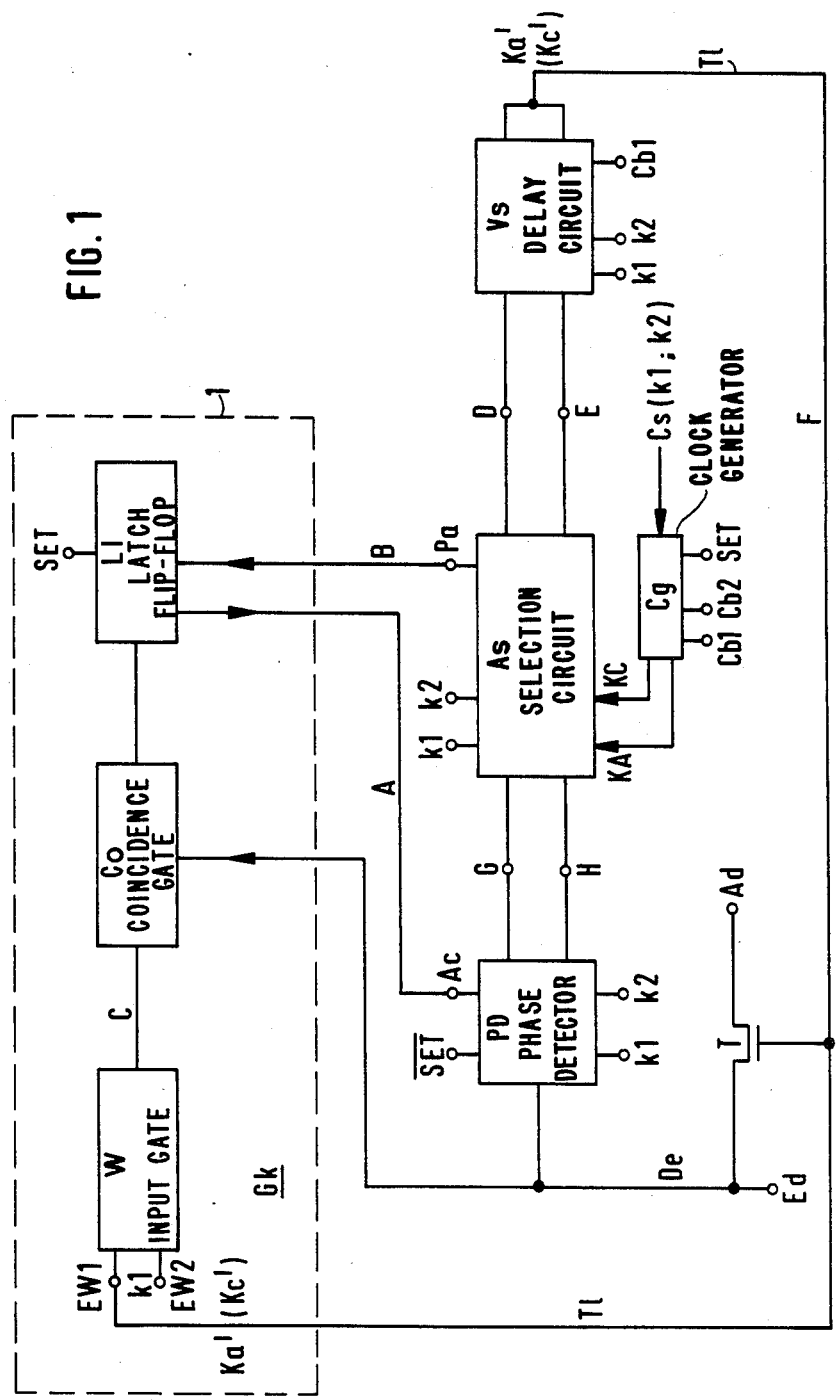
FIG. 1 is a block diagram of a selection logic in which the integrable circuit arrangement is used to activate a phase detector.
Figure 2:
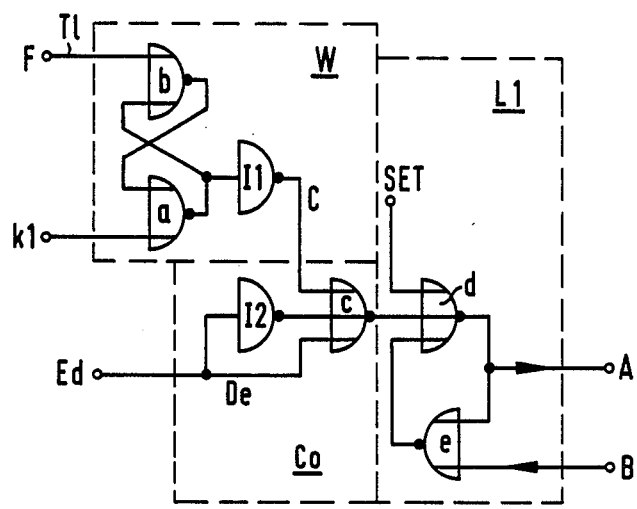
FIG. 2 shows the integrable circuit arrangement in accordance with the invention.

The integrable circuit for deriving coincidence pulses on coincidences of the falling edges of a digital data signal with the falling edges of a sampling signal, henceforth called "edge coincidence detector," consists of the blocks designated W and Co in FIG. 1, which occupy the areas designated by the same reference characters in FIG. 2.

As shown in FIG. 1, the sampling signal Ka' or Kc', which is required to control the data processing system, is present on the clock line T1, which is connected to the gate electrode of the clocked transistor T, which is representative of the clocked transistors or switches of the data processing system with the data input Ed and the data output Ad.

Figure 7:
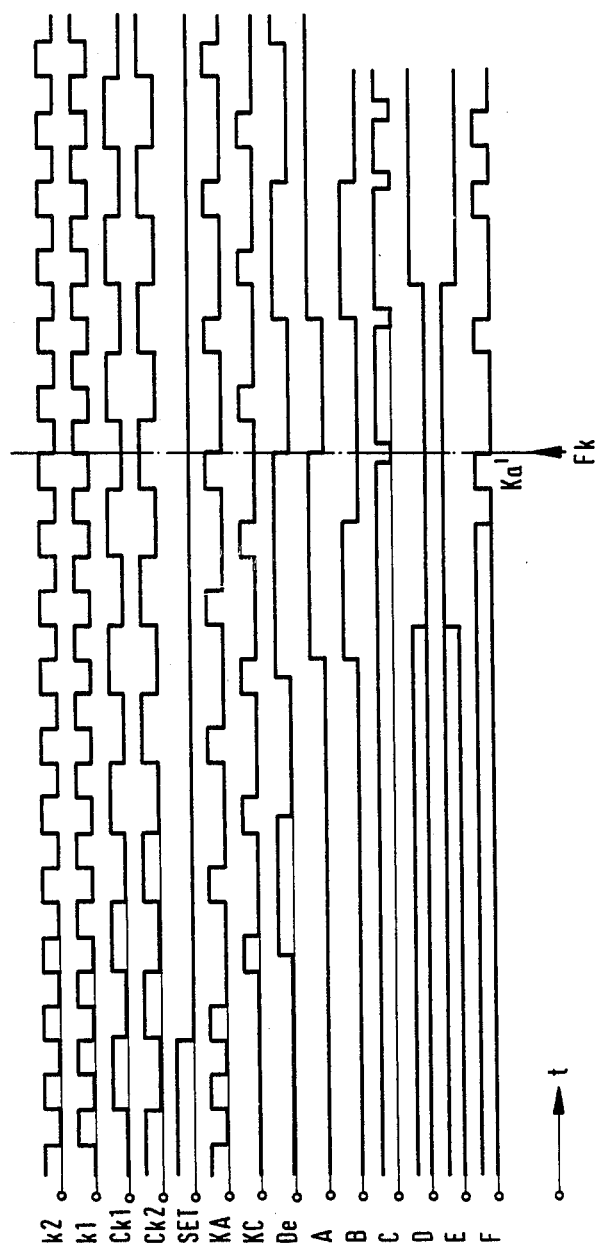
FIG. 7 serves to illustrate the operation of the selection logic of FIG. 1.

The edge coincidence detector in accordance with the invention has an input gate consisting of two cross-coupled NOR gates a and b. The clock line T1 is connected to the first input of this input gate, while The second input is supplied with one of the signals of a two-phase system clock. These two-phase system-clock signals k1, k2 are shown in FIG. 7 at the top. The bottom row illustrates the clock signal F, which, in the embodiment of the use of the integrable circuit arrangement in accordance with the invention, is switchable from the sampling signal Ka' to the sampling signal Kc'.

If the delay introduced by the first NOR gate b, to which the sampling signal Ka' or Kc' is applied, is about three times the delay introduced by the other, second NOR gate a, the output of the inverter I1, which has its input connected to the output of the second NOR gate a, provides a signal C of FIG. 7, i.e., a pulse sequence characterized by short zero levels of equal duration. These short zero levels open in the circuit Co a measuring window at the first input of the third NOR gate c for the signals appearing at the two other inputs, because, seen from the output of the third NOR gate c, level differences at the second and third inputs of this NOR gate c can be perceived only within this measuring window. The design of these measuring windows is based on the fact that the potential rise at the input of the first inverter I1, caused, for example, by the sampling signal Ka', is relatively slow due to the relatively long delay of the NOR gate b, but then is terminated abruptly by the system-clock signal k1 as soon as the latter falls below a given threshold value of the input gate a, b.

In the embodiment of an integrable circuit arrangement according to the invention which is shown in FIG. 2, the data signal De is applied to the second input of the third NOR gate c and, after being inverted by a delay element, to the third input of this gate. The delay element can be implemented with a simple inverter I2. It is thus possible to determine the falling edges of the data signal De within the measuring window of the signal C, since the zero potential directly behind the falling edges of the data signal is present at all three inputs of the third NOR gate c only for a short time. Measurement accuracy with respect to the relative positions of the falling pulse edges can be influenced via the ratio of the delays of the NOR gates a and b and via the delay produced by the delay element.

Also within the scope of the invention is, of course, the use of De Morgan's theorem, according to which the function of a NOR gate can be implemented with an AND gate with negated input signals. This means that, in the circuit arrangement of FIG. 2, the NOR gate c is replaced by a three-input AND gate whose first input is connected directly to the output of the second NOR gate a, and whose second input is presented with the data signal, while the third input is fed with the inverted, delayed data signal.

Figure 3:
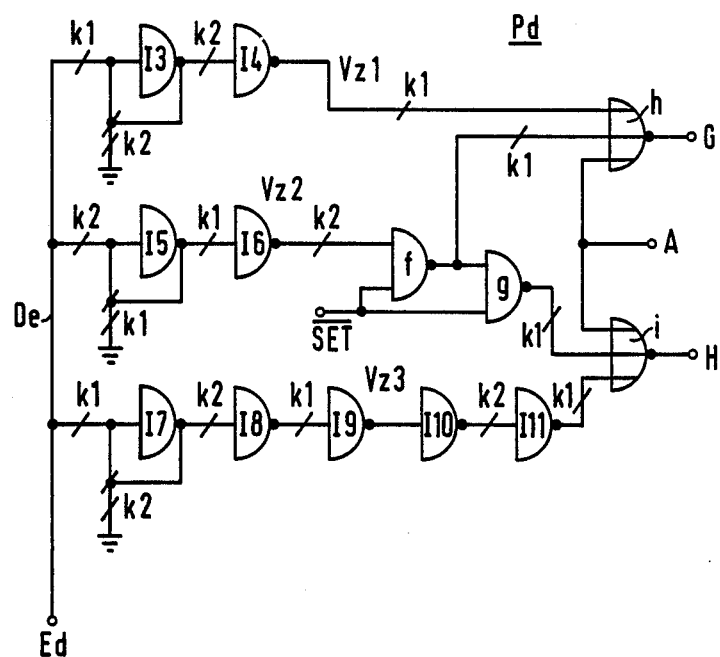
FIGS. 3 to 6 are diagrams of further circuits shown as blocks in FIG. 1.
Figure 4:
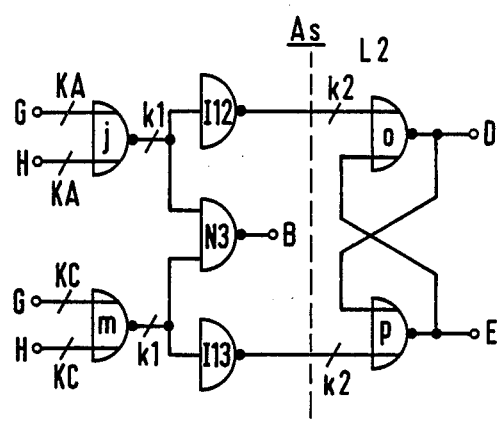

In case of an edge coincidence, the output of the arrangement formed by the two circuits W and Co in FIG. 2 thus delivers for a short time a high-level signal which is not present in the absence of coincidence. This coincidence signal is preferably stored in a first latch flip-flop L1 to permit a short-time phase measurement by means of a phase detector if the edge coincidence detector in accordance with the invention is used within a sampling pulse selection logic. The circuit diagram of the phase detector is shown in FIG. 3. The latch flip-flop L1 in FIG. 2 consists of two NOR gates d, e each having its output coupled to one of the inputs of the other NOR gate as usual. One of the NOR gates d has a third input, namely a set input, to which the set signal SET=zero is applied for initiating the phase measurement by means of the phase detector Pd, as shown in FIG. 7. The output of the fourth NOR gate d provides an enable signal A for the phase detector Pd. That completes the description of the integrable circuit arrangement in accordance with the invention, formed by the blocks W and Co within the box 1 in FIG. 1, and of the latch flip-flop L1.

The preferred use of the integrable circuit arrangement in accordance with the invention in a selection logic for selecting one of two sampling signals whose edges do not coincide with the edges of the data signal will now be described in more detail with the aid of an embodiment.

This selection logic is shown in FIG. 1 as a block diagram outside the box 1 bounded by a broken line. It contains the phase detector Pd, whose circuit diagram is given in FIG. 3, the selection circuit As, whose diagram is given in FIG. 4, and the delay arrangement Vs, whose circuit diagram is shown in FIG. 6. To clock the selection circuit As, a two-phase clock KA, KC is necessary which is generated in the clock generator Cg from the two-phase system clock Cs and the two-phase basic clock Cb1, Cb2 following the set signal SET. All blocks of the selection logic are supplied with the two-phase system-clock signals k1, k2, as shown in FIG. 1. These signals control switches which are indicated in FIGS. 3 to 6 by strokes crossing the leads and designated k1, k2. If the circuit is realized using MOS technology, these switches will be implemented with MOS field-effect transistors whose gate electrodes are presented with the respective system-clock signals.

The circuit of the phase detector Pd of FIG. 3 has an enable input to which the enable signal A is applied. The zero levels of the enable signal are the enabling levels. The phase detector Pd is enabled by applying the enable signal A to the third input of each of two three-input NOR gates h, i.

The phase detector Pd contains, in principle, a plurality of delay lines clocked by the system-clock signals k1, k2 and producing different delays. They form a first pair of delay lines providing relatively short delays, and a second pair of delay lines providing relatively long delays. The first delay line Vz1 contains only two inverters I3 and I4 whose inputs are preceded by switches through which the data signal De from the data input Ed can be applied, as shown in FIG. 3.

As shown in FIG. 7, in case of a coincidence Fk of an edge of the data signal De and an edge of one of the sampling signals Ka', the enable signal A=zero enables the two NOR gates h and i to accept the first zero-to-one transition and to determine the position of this transition relative to the system-clock signals k1 and k2 as soon as the overall arrangement has been set by SET=zero at the latch flip-flop L1 and SET=one at the two NAND gates f and g of the second delay line Vz2 of the phase detector Pd of FIG. 3. The purpose of the second delay line Vz2 being settable is only to improve the testability of the overall arrangement.

The second delay line Vz2, like the first delay line Vz1, contains two inverters I5 and I6, but the first inverter I5 of this delay line Vz2 is fed with the data signal De on a pulse of the system-clock signal k2. The NAND gates f and g can be replaced by inverters if testability is not necessary. The second delay line Vz2 is obviously a tapped delay line which replaces two delay lines of equal delay and applies to the NOR gate i a signal which is inverse to that applied to the NOR gate h. During the pulses of the system-clock signal k1, the delay line Vz2 delivers a signal which is delayed by one and a half the delay of the signal provided by the first delay line Vz1. The tapped delay line Vz2 may, of course, be replaced by two delay lines which are supplied with input signals on the pulses of the system-clock signal k2 and provide output signals to the two NOR gates h, i during the pulses of the system-clock signal k1.

The phase detector Pd contains a third delay line Vz3, which supplies to the NOR gate i a signal which is delayed by twice the delay of the first delay line Vz1, but shifted in phase by 180 degrees by means of an inverter I9, which does not have a switch at its output and, therefore, does not contribute to the delay.

For limiting purposes, the output of the first inverter of each of the delay lines of the phase detector is connected to the gate electrode of a field-effect transistor (not shown) whose source-drain path, on the one hand, is connected to the inverter input and, on the other hand, is grounded through a switch that is operated with the system-clock signal which clocks the switch at the output of the respective inverter. The phase detector Pd of FIG. 3 has a peculiar characteristic in that it provides at the two outputs G and H, the signal combination G=one, H=zero for a short time during the clock period of the system-clock signals k1, k2 if the falling edge of the data signal De occurs during k1, and that it provides the signal combination G=zero, H=one if this transition occurs during k2. This makes it possible to select a suitable sampling signal from two available sampling signals.

Figure 5:
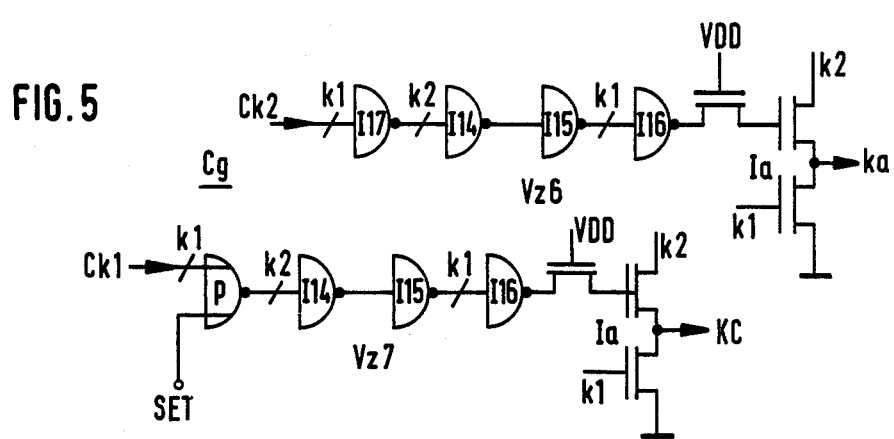
Figure 6:
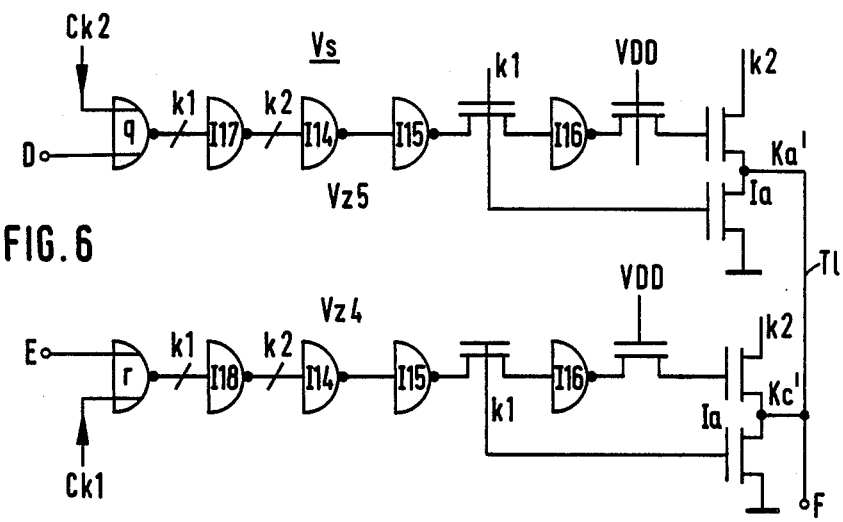

To obtain these sampling signals offered for selection, i.e., the signals Ka' and Kc', delay circuits as used in the delay arrangement Vs of FIG. 6 and in the clock generator Cg of FIG. 5 are employed, the clock generator Cg serving to derive the clock signals KA and KC. The delay lines Vz6 and Vz7 of the clock generator Cg of FIG. 5 and the delay lines Vz4 and Vz5 of the delay arrangement Vs of FIG. 6 with the inverters I14 to I16 each having an inverter Ia at their outputs. The voltage supply to this output inverter Ia is constituted by the second system-clock signal k2, while the switching transistor in series therewith is driven with the first system-clock signal k1. The outputs of the output inverters of the delay arrangement Vs are connected to the clock line T1 and, thus, to the first input of the input gate of the integrable circuit arrangement in accordance with the invention.

The basic clock, consisting of the basic clock signals Ck1 and Ck2, is derived from the system-clock signals k1 and k2 by simple frequency division. The second basic clock signal Ck2 is fed through the input inverter I17 into the delay line Vz6 during the pulses of the system-clock signal k2. In the case of the delay line Vz7, the first basic clock signal Ck1 is applied via the first input of the input NOR gate p, so that it is possible to activate the clock signal KC only after application of the set signal SET=zero. The two clock signals KA and KC provided by the clock generator Cg serve to switch the switches at the outputs of the sixth and seventh NOR gates h, i to the conducting state. The outputs of these two NOR gates h, i are connected to the two inputs of the NAND gate N3 via switches which can be rendered conductive by the system-clock signal k1. This NAND gate N3 produces at its output the 1 state of the reset signal B as soon as the output signals of the two NOR gates are different (or zero), i.e., as soon as it is indicated on which the system-clock signals k1 and k2 the transition took place. This information is entered during the pulses of the system-clock signal k2 into the latch flip-flop L2, which contains the two cross-coupled NOR gates o,p. The information stored in the latch flip-flop L2 serves to select one of the two sampling signals Ka', Kc'. To this end, the first output signal E is available at the first output, and the inverted second output signal D at the second output. These signals are shown in FIG. 7. Each of them is applied to the first input of one of the two input NOR gates of the delay arrangement Vs of FIG. 6. In FIG. 7, the event of an edge coincidence, where the falling edge of a pulse of the data signal De coincides with the falling edge of a pulse of sampling signal Ka', is designated Fk. This sampling signal Ka' appears at the output of the delay line Vz5 of the delay arrangement Vs since the output of this delay line is at zero potential because of D=zero at the first input of the input NOR gate q. Immediately after this coincidence, the phase detector Pd is enabled by A=zero.

On the occurrence of given successive pulses of the system-clock signal k1, the phase detector then provides a binary signal G, H, which contains the information as to whether an edge coincidence occurs on the occurrence of a pulse of the system-clock signal k1 of k2. To switch to the noncoinciding one of the two sampling signals ka' and kc', however, this information must be synchronized, because an unambiguous assignment for correct switching to one of the two suitable binary values zero/one or one/zero is obtained only on particular pulses which are not simultaneous with pulses of the clocks KA and KC.

These suitable binary values are derived by means of the two NOR input gates j and m of the selection circuit As. The inputs of these NOR input gates j and m are connected, respectively, to the outputs of the sixth NOR gate h and the seventh NOR gate i via switches which are switched to the conducting state by the clocks KA and KC. The clocks KA and KC are generated in the clock generator Cg of FIG. 5. Such clocking gives the two suitable binary values zero/one or one/zero: the first binary value is the value of the output signal G of the NOR gate h on the occurrence of a given pulse of the KA clock, and the second binary value is the value of the output signal H of the NOR gate i on the occurrence of the following pulse of the KC clock.

It should be noted that, in FIG. 3, the first delay line Vz1 delays the falling edges of the data signal De by one full clock period and does not invert them. Since the input switch of the second delay line Vz2 is switched to the conducting state by the system-clock signal k2, the input signal is transferred with a delay of two clock periods as an inverted signal to the NOR gate h and as a noninverted signal to the NOR gate i because the latter is preceded by the NAND gate g. The signal applied to the third delay line Vz3 is transferred to the NOR gate i in inverted form and with a delay of two clock periods because the signal path of this delay line includes the additional inverter I10, whose input is not preceded by a switch.

The output signals D and E switch the input circuits q and r of the delay arrangement Vs of FIG. 6, each of which is implemented with a NOR gate. According to the assigned output signal F, the input circuits q and r are fed with the two-phase basic clock signals Ck1 and Ck2, respectively, which were derived from the system-clock signals k1 and k2 frequency division, as illustrated in FIG. 7. Located at the output of each of the two delay lines Vz5 and Vz4 is an output inverter Ia, whose voltage supply is constituted by the second system-clock signal k2. The switching transistor, whose source electrode is grounded, is driven with the first system-clock signal k1, so that a bootstrap arrangement is obtained. The output of each of the inverters Ia is connected to the clock line T1. The delay lines Vz4 and Vz5 produce the same delays and have the same output inverters as the sixth delay line Vz6 and the seventh delay line Vz7, respectively, of the clock generator Cg of FIG. 5, which serve to derive the clocks KA and KC. The delay lines only serve to improve the synchronization.

The frequency of the system-clock signals must be chosen to be equal to twice the data rate, i.e., the minimum pulse width of the data signal is equal, to twice the pulse width of the system clock. The frequency of the clocks KA, KC and Ka', Kc', which are formed by alternate gating of the system-clock signals k1, k2, is thus equal to the data rate. In a practical circuit, the data rate was 7 MHz, so that the rate of the basic clock Ck1, Ck2 was 16 MHz. The sampling signals Ka, Kc' derived from the basic clock and the system clock signals k1, k2 with a small amount of gating circuitry coincide with the edges of the data signal more rarely than is the case with clock signals of greater width. The circuit arrangement in accordance with the invention requires little area on an integrated-circuit chip and is thus suitable for monolithic integration on any VLSI circuit of a system of VLSI circuits.

What is claimed is:

1. An integrable circuit arrangement for use with a data signal and with sampling signals present on a clock line, said data signal and said sampling signals comprising pulses having rising edges and falling edges that define said pulses, said integrable circuit deriving coincidence pulses on coincidences of said falling edges of said pulses of said data signal with said falling edges of pulses of said sampling signals, said sampling signals derived from a two-phase system clock for the purpose of controlling a digital data processing system, said integrable circuit arrangement comprising:

an input gate comprising a first NOR gate and a second NOR gate, each of said first and said second NOR gates introducing a respective delay to signals gated therethrough, said first and second NOR gates being cross-coupled, a first input of said input gate being connected to a clock line to receive a first sampling signal and a second sampling signal and a second input of said input gate being supplied with a first clock signal of a two-phase system clock, the delay introduced by said first NOR gate being longer than the delay introduced by said second NOR gate, the output of said second NOR gate being coupled to a first input of a three-input third NOR gate through an inverter, a second input of said third NOR gate being supplied with a data signal, and a third input of said third NOR gate being connected to an output of an inverting delay element, said inverting delay element having an input supplied with said data signal.

2. An integrable circuit arrangement as defined in claim 1 wherein said sampling signals are formed by alternate selection of pulses from said first clock signal and a second clock signal produced by said two-phase system clock, said clock signals having a frequency equal to twice the data rate.

3. An integrable circuit arrangement as defined in claim 1 or 2 additionally comprising a first latch flip-flop comprising a three-input fourth NOR gate and a fifth NOR gate, one input of said fourth NOR gate being provided with a set signal and one input of said fifth NOR gate being provided with a reset signal, the output of said fourth NOR gate providing an enable signal for a phase detector.

4. An integrable circuit arrangement as defined in claim 3 additionally comprising a phase detector which contains a first pair of delay lines providing relatively short delays and a second pair of delay lines providing relatively long delays, said delay lines being clocked by said clock signals.

5. An integrable circuit arrangement as defined in claim 4 wherein each of said pairs of delay lines contains a first delay line to which said data signal is provided via a switch rendered conductive by one of said clock signals, and a second delay line which provides the same delay and to which said data signal is provided via a switch rendered conductive by the other of said clock signals, additionally comprising:
a three-input sixth gate and a three-input seventh gate, each of said sixth hand seventh gates having one input coupled to receive said enable signal, the other inputs of said sixth gate each connected to the output of one of said delay lines of said first pair, and the other inputs of said seventh gate being connected to the output of one of said delay lines of said second pair.

6. An integrable circuit arrangement as defined in claim 4 wherein said delay lines which receive said data signal simultaneously on the same pulse of said clock signals comprise tapped delay lines.

7. An integrable circuit arrangement as defined in claim 3 wherein said data signal is supplied to the input of a first delay line via first switch rendered conductive by said first clock signal produced by said two phase system clock;
said data signal also being supplied to the input of a second delay line via second switch rendered conductive by said second clock signal, said second delay line producing the same delay as said first delay line;
said data signal also being supplied to the input of a third delay line via a third switch rendered conductive by said first clock signal, the delay of said third delay line being at least one clock period longer than the delays of said first and said second delay lines;
the output signal of said first delay line being supplied to a first input of a three-input sixth NOR gate and the inverted output signal of said second delay line being supplied to a second input of said sixth NOR gate; and
the output signal of said second delay line being supplied to a first input of a seventh NOR gate and the inverted output signal of said third delay line being supplied to a second input of said seventh NOR gate, said enable signal being applied to the third inputs of said sixth and said seventh NOR gate.

8. An integrable circuit arrangement as defined in claim 7 wherein the outputs of said sixth and said seventh NOR gates are each connected via a switch rendered conductive by a third clock signal to one of the two inputs of a first NOR input gate of a selection circuit and via a switch rendered conductive by a fourth clock signal to one of the two inputs of a second NOR input gate of said selection circuit, said third and fourth clock signals being formed by alternate gating from said first and second clock signals;
the output signal of said first NOR input gate being supplied through a switch rendered conductive by said first clock signal to the input of an inverter having its output connected via a switch rendered conductive by said second clock signal to a first input of a second latch flip-flop;
the output signal of said second NOR input gate being applied through a switch rendered conductive by said first clock signal to the input of an inverter having its output connected via a switch rendered conductive by said second clock signal to a second input of said second latch flip-flop, said second latch flip-flop comprising two cross-coupled NOR gates, said second latch flip-flop providing a first output signal at one of its outputs and a second inverted output signal at the other of its outputs for the selection of said first sampling signal and said second sampling signal; and
the outputs of said first and second NOR input gates of said selection circuit being each connected to one of the inputs of a NAND gate whose output provides said reset signal for said fifth NOR gate.

9. An integrable circuit arrangement as defined in claim 8 wherein one of said first and second output signals of said second latch flip-flop controls an input gate of a fourth delay line and the other of said first and second output signals of said second latch flip-flop controls an input gate of a fifth delay line, one of said input gates of said fourth and fifth delay lines being provided with a fifth clock signal and the other of said input gates being provided with a sixth clock signal, said fifth and sixth clock signals being derived from said first and second clock signals by frequency division;
the output of each of said fourth and fifth delay lines being connected to the gate electrode of a respective load transistor of a respective output inverter, the voltage supply of said output inverters being said second clock signal and said output inverters being connected to a respective switching transistor which is driven by said first clock signal, the output of said output inverters being connected to said clock line;
said first and said second sampling signals being formed by alternate gating from said first and second clock signals by a gating circuit comprising a sixth delay line and a seventh delay line, said sixth and seventh delay lines having the same delay, the output of each of said sixth and seventh delay lines being connected to the gate electrode of a respective second load transistor of a respective second output inverter, the voltage supply of said second output inverters being said second clock signal and said second output converters being connected to a respective switching transistor which is driven by said first clock signal;

the outputs of said second output inverters forming said third and fourth clock signals used to control said first and second NOR input gates of said selection circuit.

10. An integrable circuit arrangement for use with a data signal and with sampling signals present on a clock line, said data signal and said sampling signals comprising pulses having rising edges and falling edges that define said pulses, said integrable circuit deriving coincidence pulses on coincidences of said falling edges of said pulses of said data signal with said falling edges of said pulses of said sampling signals, said sampling signals derived from a two-phase system clock for the purpose of controlling a digital data processing system, said integrable circuit comprising:

an input gate comprising a first NOR gate to which said sampling signal is applied and a second NOR gate, each of said first and said second NOR gates introducing a respective delay to signals gated therethrough, said first and second NOR gates being cross-coupled, a first input of said input gate being connected to a clock line and a second input of said input gate being supplied with one of the signals of a two-phase system clock, the delay introduced by said first NOR gate being longer than the delay introduced by said second NOR gate, the output of said second NOR gate being coupled to a first input of a three-input NAND gate, a second input of said NAND gate being presented with said data signal, and a third input of said NAND gate being connected to an output of an inverting delay element, said inverting delay element having an input supplied with said data signal.

* * * * *